US012645155B2

(12) United States Patent
Chiu et al.

(10) Patent No.: US 12,645,155 B2
(45) Date of Patent: Jun. 2, 2026

(54) RETICLE POD PROVIDED WITH RETICLE SUPPORT FOR ABSORBING DOWNWARD PRESSURE

(71) Applicant: GUDENG PRECISION INDUSTRIAL CO., LTD., New Taipei (TW)

(72) Inventors: Ming-Chien Chiu, New Taipei (TW); Chia-Ho Chuang, New Taipei (TW); Chang-Da Liu, New Taipei (TW); Hsin-Min Hsueh, New Taipei (TW)

(73) Assignee: GUDENG PRECISION INDUSTRIAL CO, . LTD., New Taipei (TW)

( * ) Notice: Subject to any disclaimer, the term of this patent is extended or adjusted under 35 U.S.C. 154(b) by 0 days.

(21) Appl. No.: 18/758,155

(22) Filed: Jun. 28, 2024

(65) Prior Publication Data

US 2025/0053100 A1     Feb. 13, 2025

Related U.S. Application Data

(60) Provisional application No. 63/531,587, filed on Aug. 9, 2023.

(51) Int. Cl.
| | |
|---|---|
| *G03F 1/66* | (2012.01) |
| *G03F 7/00* | (2006.01) |
| *H10P 72/10* | (2026.01) |
| *H10P 72/76* | (2026.01) |

(52) U.S. Cl.
CPC ............ *G03F 7/70741* (2013.01); *G03F 1/66* (2013.01); *G03F 7/70033* (2013.01); *H10P 72/1906* (2026.01); *H10P 72/7614* (2026.01)

(58) Field of Classification Search
CPC .... G03F 1/66; G03F 7/70033; G03F 7/70741; H01L 21/67359; H01L 21/6875; B65D 25/10
USPC ............................................... 206/454, 316.1
See application file for complete search history.

(56) References Cited

U.S. PATENT DOCUMENTS

| | | | | |
|---|---|---|---|---|
| 7,259,835 | B2 * | 8/2007 | Matsutori | G03F 7/70741 |
| | | | | 355/75 |
| 7,931,146 | B2 * | 4/2011 | Chiu | G03F 1/66 |
| | | | | 206/454 |
| 8,353,404 | B2 * | 1/2013 | Chiu | H01L 21/67373 |
| | | | | 206/454 |
| 2006/0201958 | A1 * | 9/2006 | Tieben | H01L 21/67353 |
| | | | | 220/4.23 |
| 2009/0218254 | A1 * | 9/2009 | Andersen | H01L 21/67386 |
| | | | | 206/524.6 |

(Continued)

*Primary Examiner* — Steven A. Reynolds
(74) *Attorney, Agent, or Firm* — Troutman Pepper Locke LLP; Tim Tingkang Xia, Esq.

(57) ABSTRACT

The present disclosure provides a reticle pod comprising a base and at least one reticle support disposed on the base, the reticle support reticle support is arranged for carrying a reticle and has a resilient means. When the downward pressure applied to the reticle support is less than or equal to a critical value, a height of the reticle support is maintained at a predetermined height; when the downward pressure applied to the reticle support is greater than the critical value, the reticle support absorbs the downward pressure by deforming, and then the reticle support restores to the predetermined height only when the downward pressure is shared by another reticle support.

12 Claims, 7 Drawing Sheets

(56) References Cited

U.S. PATENT DOCUMENTS

| | | | |
|---|---|---|---|
| 2011/0155598 A1* | 6/2011 | Lu | G03F 1/66 |
| | | | 206/349 |
| 2012/0175279 A1* | 7/2012 | Ku | G03F 7/70741 |
| | | | 206/454 |
| 2019/0214287 A1* | 7/2019 | Chiu | G03F 7/70733 |
| 2020/0249563 A1* | 8/2020 | Hsueh | G03F 7/70733 |

* cited by examiner

200

200'

RETICLE POD PROVIDED WITH RETICLE SUPPORT FOR ABSORBING DOWNWARD PRESSURE

CROSS-REFERENCE TO RELATED APPLICATIONS

This application claims priority to U.S. Provisional Patent Application No. 63/531,587 filed on Aug. 9, 2023 which is hereby incorporated by reference in its entirety.

BACKGROUND OF THE INVENTION

Field of the Invention

The present disclosure relates to a reticle pod, and more particularly to a reticle pod provided with a reticle support for absorbing a downward pressure.

Description of the Prior Art

In a current extreme ultraviolet (EUV) lithography process, a reticle is primarily protected by a dual pod (extreme ultraviolet (EUV) reticle transport pod). A current dual pod includes an outer pod (EOP) and an inner pod (EIP). The reticle is received in the inner pod, and the inner pod is received in the outer pod.

When the dual pod is in an exposure machine during an operation, the outer pod and the inner pod are opened to expose the reticle, and then the reticle is taken out by a mechanical arm. While the mechanical arm places back the reticle, if the reticle is not kept at a horizontal state by the mechanical arm due to certain reasons, that is, if four corners of the reticle are substantially not on a same horizontal plane, it is possible that the reticle first comes into contact with one of support members of a base by only one of its corners. At this point in time, if the mechanical arm lacks a regulation or buffer mechanism such that a reverse force of the support is overly concentrated on one corner of the reticle, severe collision and friction can be caused between this corner of the reticle and the corresponding support member, further resulting in particles and even damage and contamination of the reticle.

SUMMARY OF THE INVENTION

In view of the issues above, the present disclosure provides a reticle pod provided with a support member for absorbing a downward pressure. The support member is capable of absorbing an excessive load when the reticle is picked up or placed so as to prevent collision and friction between the reticle and a corresponding support member, further preventing wear and contamination of the reticle or the support member.

It is an object of the present disclosure to provide a reticle pod including a base and at least one reticle support disposed on the base. The reticle support is for carrying a reticle and has a resilient means. When a downward pressure applied to the reticle support is less than or equal to a critical value, a height of the reticle support is maintained at a predetermined height; when the downward pressure applied to the reticle support is greater than the critical value, the reticle support absorbs the downward pressure by deforming, and then the reticle support restores to the predetermined height only when the downward pressure is shared by another reticle support.

In a specific embodiment, the resilient means is a resilient material, a spring or a hollow structure, and the critical value is determined according to the resilient means.

In a specific embodiment, the reticle support has a protrusion. The protrusion has a resilient material such that the protrusion can form an elastic contact with a reticle, wherein the resilient material is rubber or a thermoplastic elastomer (TPE).

In a specific embodiment, the reticle support absorbs the downward pressure by compression and deformation of the resilient material.

In a specific embodiment, the reticle support has a resilient element provided on a bottom portion thereof, so that the reticle support forms an elastic connection with the base of the reticle pod by the resilient element.

In a specific embodiment, the resilient element withstands the downward pressure greater than the critical value, and correspondingly deforms, sinks and absorbs the downward pressure.

In a specific embodiment, the resilient element is a spring, and the reticle support is connected to the base by the spring.

In a specific embodiment, the resilient element is a plurality of elastic washers, and the reticle support is connected to the base by the elastic washers.

In a specific embodiment, the plurality of elastic washers match with a plurality of fastening members of the reticle support to secure the reticle support to the base.

In a specific embodiment, the reticle support has a protrusion and two edge limiters located on two sides of the protrusion, and the plurality of elastic washers are disposed below the protrusion and the two edge limiters of the reticle support.

In a specific embodiment, a weight of the reticle is greater than or equal to 320 g to 330 g, and the critical value is greater than or equal to 3.14 N.

In a specific embodiment, the predetermined height ranges between 0.17 mm and 0.23 mm.

DETAILED DESCRIPTION OF THE EMBODIMENTS

Figure 1A:
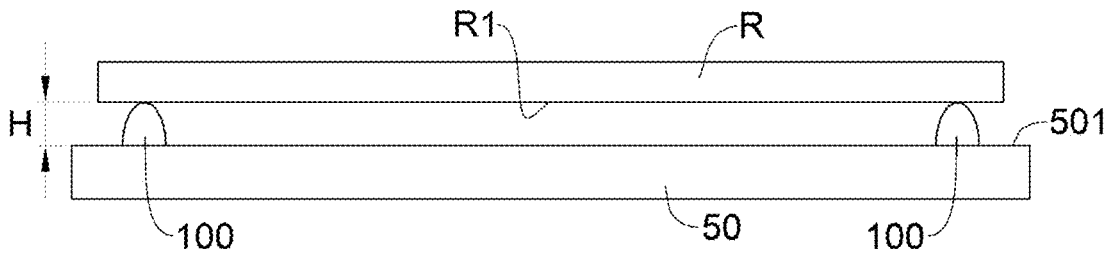
FIG. 1A is a schematic diagram of a reticle base carrying a reticle in a normal state according to a first embodiment of the present disclosure.

The present disclosure provides a reticle pod including at least one reticle support for absorbing a downward pressure. The reticle support has a resilient means, and absorbs the downward pressure and buffers an excessive downward pressure by the resilient means. To render the description of the present disclosure clear, only a reticle and a base of a reticle pod of the present disclosure are depicted in the drawings.

Referring to FIG. 1A, FIG. 1A shows a schematic diagram of a reticle base (for example, the base of the inner pod of the dual pod described above) carrying a reticle R in a normal state. A reticle support 100 of the present disclosure is disposed on an upper surface 501 of a base 50 of the reticle pod, and is for carrying the reticle R. When the reticle R is placed on the reticle support 100, a predetermined height H is maintained between a lower surface R1 of reticle R and a upper surface 501 of the base 50, that is, a height by which the reticle support 100 that is not compressed extends upward from the upper surface 501, and more specifically, a height by which the reticle support 100 is exposed from the upper surface 501. In an embodiment of an inner pod (or an EIP) of a dual pod, the predetermined height H ranges between 0.17 mm and 0.23 mm.

Figure 1B:
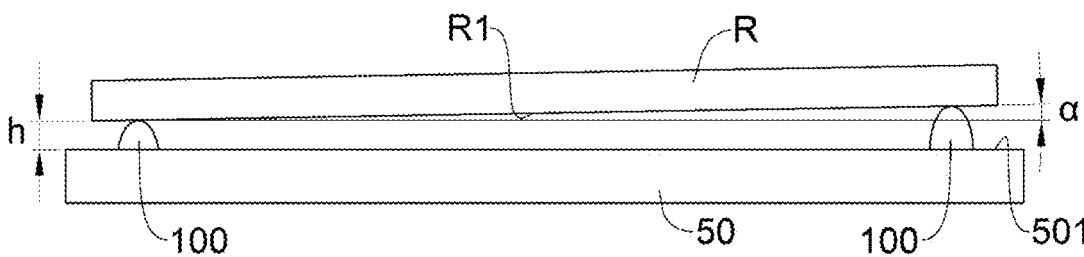
FIG. 1B shows a schematic diagram of a reticle base that is inclined when a reticle receives an external force according to the first embodiment of the present disclosure.

As shown in FIG. 1B, the reticle support 100 of the present disclosure is configured such that, when the reticle R is placed or picked up and a downward pressured caused by an inclination of the reticle R is overly concentrated on a single or few reticle supports 100, and a normal force of the reticle support 100 applied to a corner of the reticle support 100 is greater than a critical value, the downward pressure is absorbed by a resilient means of the reticle support 100. With the resilient means, the reticle support 100 inevitably forms a height h less than the predetermined height H between the lower surface R1 and the upper surface 501 of the base 50, such that the lower surface R1 and the upper surface 501 define an angle α, and the reticle support 100 first came into contact with the reticle then restores to the predetermined height H only when the downward pressure is shared by another reticle support 100. The design for the critical value of the reticle support 100 can be determined according to a weight of the reticle and/or a downward pressure provided by a motion means of a mechanical arm. For example, when the weight of the reticle is greater than or equal to 320 g to 330 g, the critical value can be designed to be greater than or equal to 3.14 N via the material and the structure of the reticle support 100. In this case, when the downward pressure received by one single reticle support 100 that is in contact with the reticle is greater than 3.14 N, the resilient means of the reticle support 100 intervenes and generates action to absorb the downward pressure, thus preventing the corresponding corner of the reticle from withstanding an overly large normal force.

In a first embodiment of the present disclosure, a resilient material, which is compressible and resilient, and has high temperature resistance, high wear resistance or high plasticity, is selected as a material for the resilient means for the reticle support 100. The material includes, for example but not limited to, rubber or a thermoplastic elastomer (TPE), such as thermoplastic rubber (TPR), thermoplastic vulcanizate (TPV), thermoplastic polyurethane (TPU), or thermoplastic polyester elastomer (TPEE).

Thus, when the reticle support 100 is formed of a resilient material, a top end of the reticle support 100 forms an elastic contact with the lower surface R1 of reticle R, and the reticle support 100 absorbs a downward pressure by self-compression and deformation when the downward pressure applied to one single reticle support 100 is greater than the critical value.

Figure 2A:
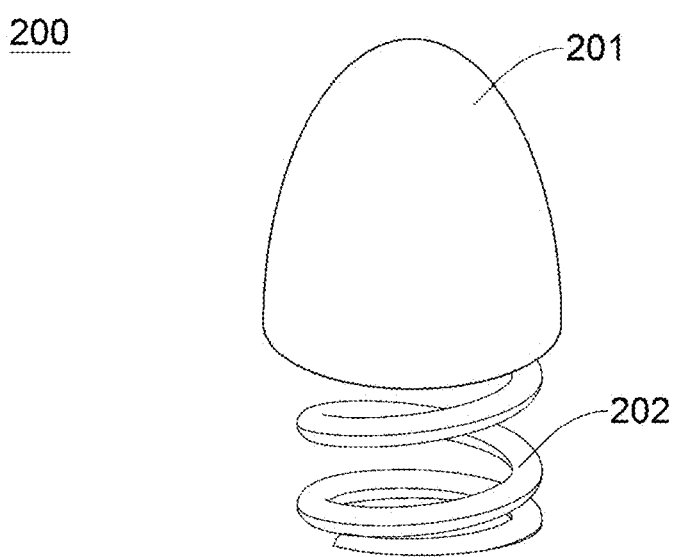
FIG. 2A is a schematic diagram of a structure of a support member according to a second embodiment of the present disclosure.
Figure 2B:
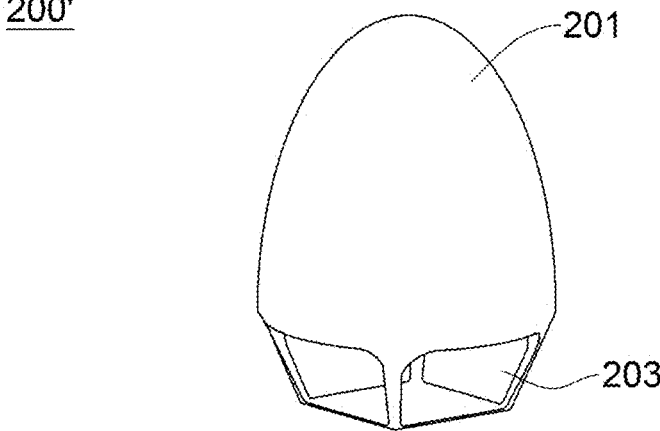
FIG. 2B is a schematic diagram of a change in a structure of a support member according to the second embodiment of the present disclosure.

Referring to FIG. 2A and FIG. 2B for a second embodiment of the present disclosure, reticle supports 200 and 200' include a protrusion 201 respectively, wherein the protrusion 201 of the reticle support 200 is joined with a connection portion 202, and the protrusion 201 of the reticle support 200' is joined with a connection portion 203. The connection portions 202 and 203 are different variation examples of resilient elements. In the second embodiment of the present disclosure, the resilient elements of the reticle supports 200 and 200' are used as the resilient means for absorbing a downward pressure. The protrusion 201 is connected or coupled to the base 50 as shown in FIG. 1A via the connection portions 202 and 203, such that the protrusion 201 can be compressed or swing relative to the upper surface 501. The connection portions 202 and 203 have structures more easily deformed compared with the protrusion 201 so as to absorb a downward pressure. Preferably, the connection portion 202 is a spring, a bottom of the spring can be buried in the base 50 by an appropriate connection means, and a top of the spring is connected with the protrusion 201. The connection portion 203 is a hollow structure. As shown in the drawings, the connection portion 203 primarily consists of four thin columns and a bottom panel. A material forming the thin columns can be appropriately selected, and is, for example, the resilient material described above, so as to exhibit flexibility. Thus, it is learned that, the four thin columns of the connection portion 203 can deform and flex due to a force received to thereby swing or sink the protrusion 201.

Thus, when the connection portions 202 and 203 of the reticle supports 200 and 200' are resilient elements, in response to the downward pressure applied to the reticle supports 200 and 200' greater than the critical value, the protrusions 201 of the reticle supports 200 and 200' sink slightly relative to the upper surface 501 so as to absorb the downward pressure from a corner of the reticle R. In other words, the reticle supports 200 and 200' absorb the downward pressure by deforming the resilient elements.

Preferably, the protrusions 201 or the connection portions 202 and 203 of the reticle supports 200 and 200' can be selectively formed by, for example, the resilient material of the first embodiment of the present disclosure. The protrusions 201 are connected or coupled to a mounting interface (omitted from the drawings) of the base 50 via the connection portions 202 and 203, and when a downward pressure applied to the reticle supports 200 and 200' is greater than the critical value, the protrusions 201 or the connection portions 202 and 203 absorb the downward pressure by means of compression and deformation.

Figure 3:
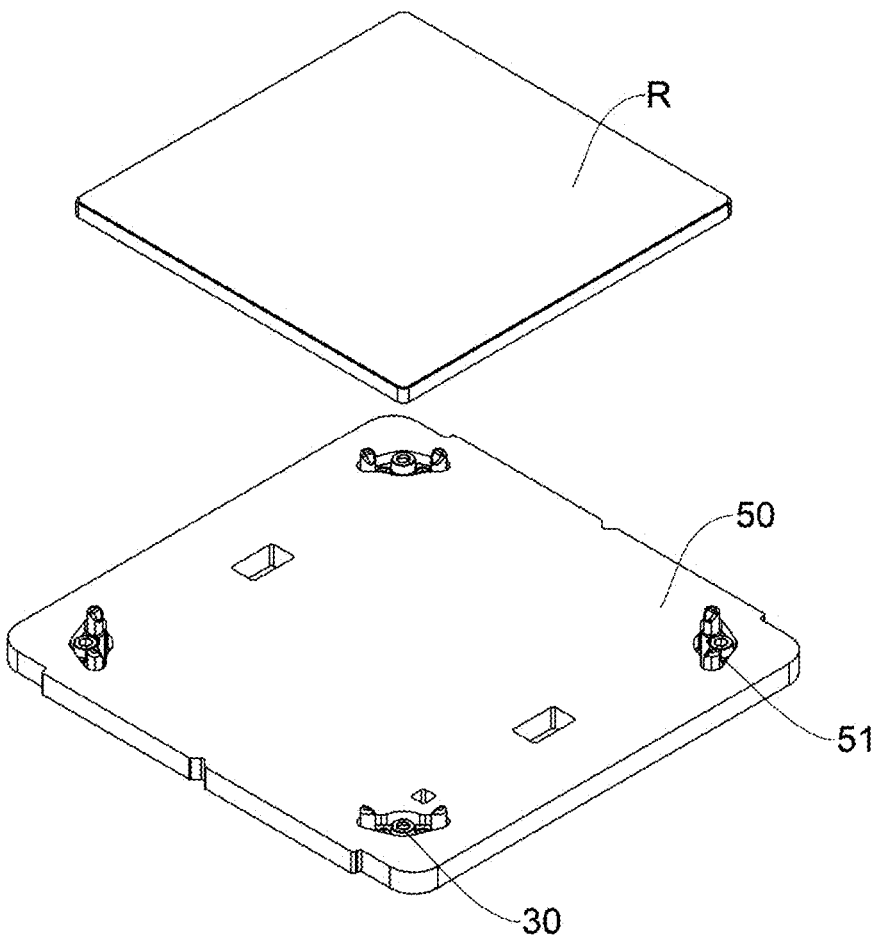
FIG. 3 is an exploded diagram of a reticle base and a reticle according to a third embodiment of the present disclosure.
Figure 4:
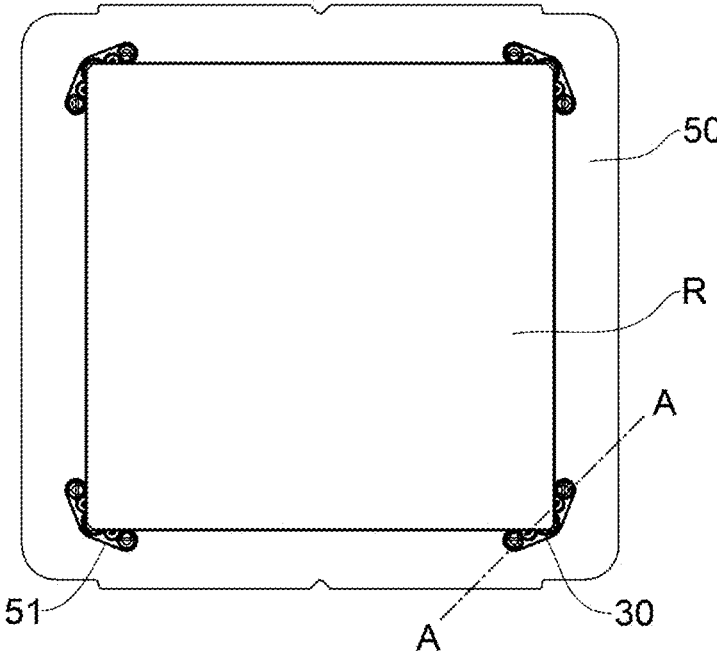
FIG. 4 is a top view of a reticle base and a reticle according to the third embodiment of the present disclosure.
Figure 5A:
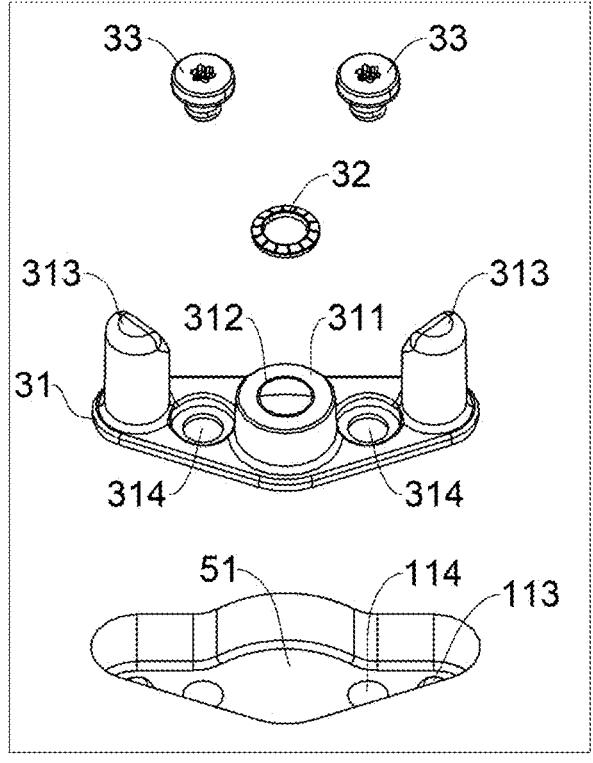
FIG. 5A is an exploded diagram of a support member according to the third embodiment of the present disclosure.
Figure 5B:
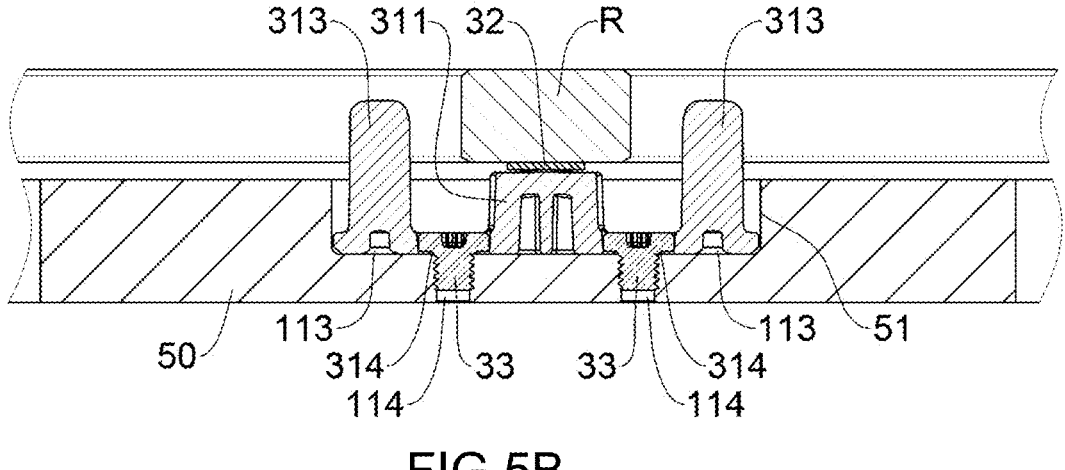
FIG. 5B is a cross-sectional diagram of a support member taken along the line A-A in FIG. 4 according to the third embodiment.

Refer to FIG. 3 to FIG. 5B for a third embodiment of the present disclosure. FIG. 3 shows a perspective diagram of the base 50 of an inner pod of a reticle pod and the reticle R, and FIG. 4 shows a top view of the base 50 carrying the reticle R, wherein mounting holes 51 are provided on four corners of the base 50 and support mechanisms 30 are disposed in the mounting holes 51. As shown in FIG. 5A and FIG. 5B, the support mechanism 30 includes a reticle support 31, an elastic washer 32 and two fastening members 33. The fastening members 33 are detachably fixed and connected to fixing holes 114 of the base 50 via two fastening holes 314 of the reticle support 31. In the third embodiment of the present disclosure, the reticle support 31 uses the elastic washer 32 as a resilient means for absorbing a downward pressure.

The reticle support 31 includes a protrusion 311 (for coming into contact with a lower surface of the reticle R), and at least one edge limiter 313 (for limiting a side edge of the reticle R). The elastic washer 32 is provided on a top of the protrusion 311, so as to come into contact with the elastic washer 32 when the reticle R is carried on the reticle support 31, and the reticle R and the protrusion 311 form an elastic contact in between. When the downward pressure applied to the reticle support 31 is greater than the critical value, the elastic washer 32 is sufficient for absorbing the downward pressure applied by the corner of the reticle R. In this case, the height by which the protrusion 311 is exposed plus a thickness of the elastic washer 32 that is compressed are inevitably less than the height by which the protrusion 311 is exposed plus the thickness of the elastic washer 32 that is not compressed, as a relationship between the predetermined height H and the height h shown in FIG. 1A and FIG. 1B. Preferably, the top of the protrusion 311 can have a notch 312 formed appropriately to match and be connected to the elastic washer 32. Preferably, the notch 312 can be configured appropriately to have the elastic washer 32 be detachably connected to the protrusion 311. By providing the elastic washer 32 at the top of the protrusion 311, a hard contact between the reticle R and the protrusion 311 is replaced by an elastic contact, and so contaminant particles and wear of the protrusion 311 can be reduced. Moreover, with the detachable means of the fastening member 33 or the notch 312, replacement of different reticle supports 31 or elastic washers 32 can be easily performed.

Figure 6A:
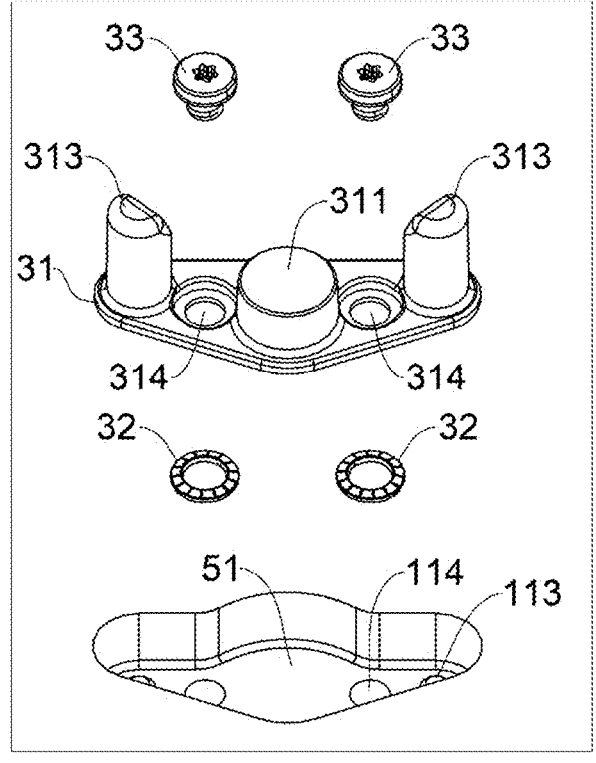
FIG. 6A is an exploded diagram of a support member of a first variation example of the third embodiment of the present disclosure.
Figure 6B:
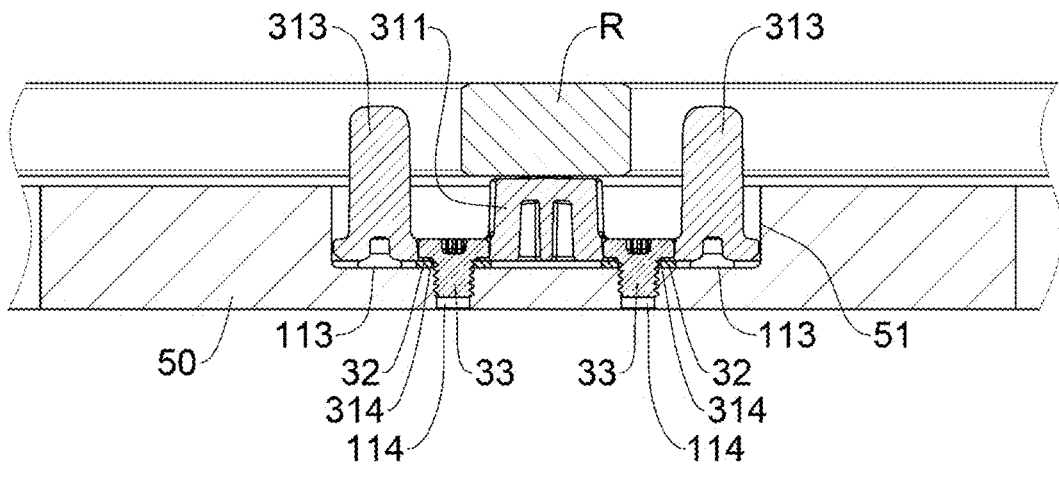
FIG. 6B is a cross-sectional diagram of a support member of the first variation example taken along the line A-A in FIG. 4 of the third embodiment.

Referring to FIG. 6A and FIG. 6B showing a first variation example of the third embodiment of the present disclosure, the first variation example of the third embodiment of the present disclosure includes two elastic washers 32 and two fastening members 33 matching each other, so as to fix the reticle support 31 to the base 50. More specifically, the elastic washer 32 is disposed between the fixing hole 114 of the base 50 and the reticle support 31, so that the reticle support 31 and the base 50 form an elastic contact in between, but the elastic washer 32 is not substantially compressed by such assembly. The fastening member 33 sequentially passes through the fastening hole 314 of the reticle support 31, the elastic washer 32 and the fixing hole 114 to mount the reticle support 31 into the mounting hole 51 of the base 50. By providing the elastic washer 32 between the reticle support 31 and the base 50, a downward pressure can be absorbed. In a feasible variation, the two elastic washers 32 can also be replaced by one single elastic washer having a pair of openings, wherein the elastic washer is similarly disposed between the fixing hole 114 of the base 50 and the reticle support 31.

Preferably, the first variation example of the third embodiment has two elastic washers 32 respectively coordinating with two fastening members 33, such that the reticle support 31 and the base 50 form an elastic contact in between, and a downward pressure is absorbed by the two elastic washers 32. In this case, the height by which the protrusion 311 is exposed plus a thickness of the elastic washer 32 that is compressed are inevitably less than the height by which the protrusion 311 is exposed plus the thickness of the elastic washer 32 that is not compressed, as a relationship between the predetermined height H and the height h shown in FIG. 1A and FIG. 1B.

Figure 7A:
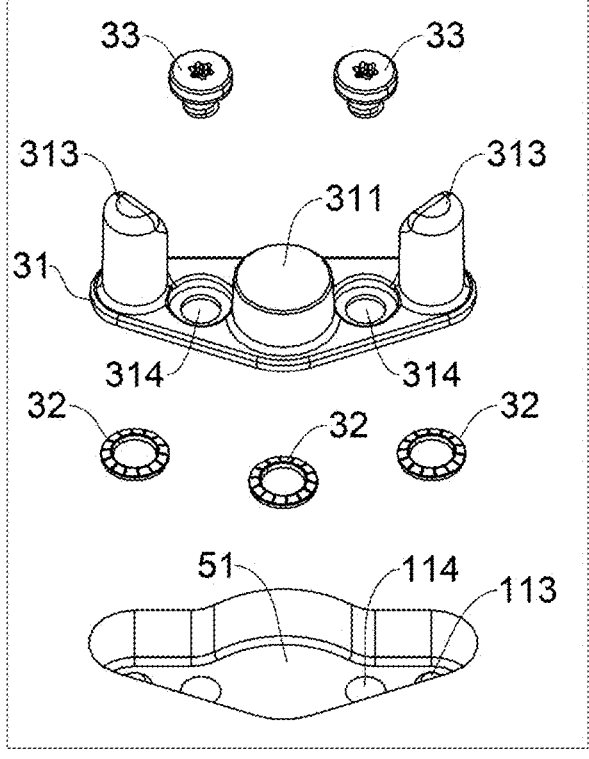
FIG. 7A is an exploded diagram of a support member of a second variation example of the third embodiment of the present disclosure.
Figure 7B:
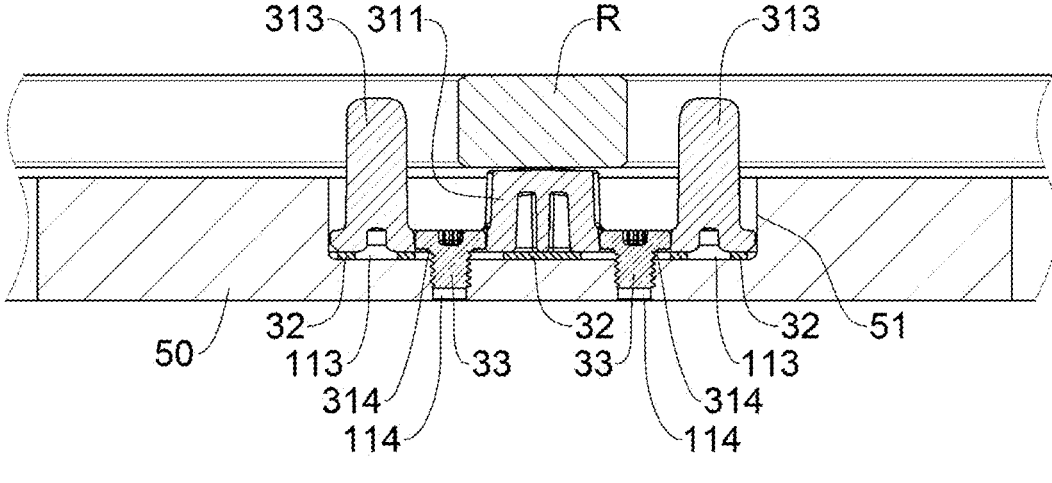
FIG. 7B is a cross-sectional diagram of a support member of the second variation example taken along the line A-A in FIG. 4 of the third embodiment.

Referring to FIG. 7A and FIG. 7B showing a second variation example of the third embodiment of the present disclosure, three elastic washers 32 are disposed below the protrusion 311 and two edge limiters 313 of the reticle support 31, such that the reticle support 31 and the base 50 form an elastic contact in between. The mounting hole 51 of the base 50 is provided with a fixing protrusion 113 corresponding to a lower part of the edge limiter 313. In the course of assembly, the elastic washer 32 can be first placed into the mounting hole 51 to surround the fixing protrusion 113, and then the reticle support 31 is placed in to limit the elastic washer 32 (without substantially compressing the elastic washer 32) by the downward pressure of the reticle support 31, so as to prevent any unnecessary displacement. In another feasible variation, the number of the elastic washer 32 can be less than three, for example, only two elastic washers 32 correspond to the edge limiter 313, or only one elastic washer 32 corresponds to the protrusion 311.

Preferably, in the second variation example of the third embodiment of the present disclosure, three elastic washers 32 are respectively disposed below the protrusion 311 and two edge limiters 313 of the reticle support 31, and a downward pressure is absorbed by the three elastic washers 32. In this case, the height by which the protrusion 311 is exposed plus a thickness of the elastic washer 32 that is compressed are inevitably less than the height by which the protrusion 311 is exposed plus the thickness of the elastic washer 32 that is not compressed, as a relationship between the predetermined height H and the height h shown in FIG. 1A and FIG. 1B.

The elastic washer 32 can be a hardware element such as a rubber washer or a spring washer for absorbing a load. With the elastic washer 32 additionally provided, loading changes during operations of different machines can be matched to flexibly adjust a mounting position and a mounting number of the elastic washer 32, so as to prevent an overly large force generated between a reticle that is picked up and placed and a support member and hence particles or damages.

The embodiments and the variation examples of the present disclosure can be combined or implemented in coordination according to actual application requirements, without departing from the concept or technical principles of the present disclosure.

What is claimed is:

1. A reticle pod, comprising a base and a plurality of at least one reticle supports disposed on the base, characterized in that:

each of the reticle supports is for carrying a reticle and has a resilient means;

wherein, when a downward pressure applied to one of the reticle supports is less than or equal to a critical value, a height of the one of the reticle supports is maintained at a predetermined height;

wherein, when the downward pressure applied to one of the reticle supports is greater than the critical value, the one of the reticle supports absorbs the downward pressure by self-compressive deforming, and then the one of the reticle supports restores to the predetermined height only when the downward pressure is shared by another reticle support.

2. The reticle pod according to claim 1, wherein the resilient means is a resilient material, a spring or a hollow structure, and the critical value is determined according to the resilient means.

3. The reticle pod according to claim 1, wherein the reticle support has a protrusion, the protrusion has a resilient material such that the protrusion can form an elastic contact with the reticle, and the resilient material is rubber or a thermoplastic elastomer (TPE).

4. The reticle pod according to claim 3, wherein the reticle support absorbs the downward pressure by compression and deformation of the resilient material.

5. The reticle pod according to claim 1, wherein each of the reticle supports has a resilient element provided on a bottom portion thereof, such that each of the reticle supports forms an elastic connection with the base by the resilient element.

6. The reticle pod according to claim 5, wherein the resilient element withstands the downward pressure greater than the critical value, and correspondingly deforms, sinks and absorbs the downward pressure.

7. The reticle pod according to claim 5, wherein the resilient element is a spring, and the reticle support is connected to the base by the spring.

8. The reticle pod according to claim 5, wherein the resilient element is a plurality of elastic washers, and each of the reticle supports is connected to the base by the elastic washers.

9. The reticle pod according to claim 8, wherein the plurality of elastic washers match with a plurality of fastening members to secure the reticle support to the base.

10. The reticle pod according to claim 8, wherein each of the reticle supports has a protrusion and two edge limiters located on two sides of the protrusion, and the plurality of elastic washers are disposed below the protrusion and the two edge limiters of the reticle support.

11. The reticle pod according to claim 1, wherein each of the reticle supports is configured to have the critical value that is greater than or equal to 3.14 N for supporting the reticle having a weight is greater than or equal to 320 g to 330 g.

12. The reticle pod according to claim 1, wherein the predetermined height ranges between 0.17 mm and 0.23 mm.

* * * * *